(12) United States Patent
Xie et al.

(10) Patent No.: US 12,100,744 B2
(45) Date of Patent: Sep. 24, 2024

(54) WRAP AROUND CONTACT PROCESS MARGIN IMPROVEMENT WITH EARLY CONTACT CUT

(71) Applicant: INTERNATIONAL BUSINESS MACHINES CORPORATION, Armonk, NY (US)

(72) Inventors: Ruilong Xie, Niskayuna, NY (US); Veeraraghavan S. Basker, Schenectady, NY (US); Andrew Greene, Slingerlands, NY (US); Alexander Reznicek, Troy, NY (US); Yao Yao, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 56 days.

(21) Appl. No.: 17/567,259

(22) Filed: Jan. 3, 2022

(65) Prior Publication Data
US 2022/0123116 A1 Apr. 21, 2022

Related U.S. Application Data

(62) Division of application No. 16/797,020, filed on Feb. 21, 2020, now Pat. No. 11,227,923.

(51) Int. Cl.
*H01L 29/417* (2006.01)
*H01L 29/40* (2006.01)
(Continued)

(52) U.S. Cl.
CPC ...... *H01L 29/41791* (2013.01); *H01L 29/401* (2013.01); *H01L 29/66795* (2013.01); *H01L 29/785* (2013.01); *H01L 2029/7858* (2013.01)

(58) Field of Classification Search
CPC ....... H01L 29/41791; H01L 2029/7858; H01L 29/401; H01L 29/66795; H01L 29/785;
(Continued)

(56) References Cited

U.S. PATENT DOCUMENTS 9,397,197 B1 7/2016 Guo et al.
9,773,913 B1 9/2017 Balakrishnan et al.
(Continued)

OTHER PUBLICATIONS

List of IBM Patents or Patent Applications Treated as Related dated Jan. 3, 2022, 2 pages.

*Primary Examiner* — Farun Lu
(74) *Attorney, Agent, or Firm* — Tutunjian & Bitetto, P.C.; Anthony Mauricio Pallone

(57) ABSTRACT

A method is presented for forming a wrap around contact. The method includes forming a p-type epitaxial region and an n-type epitaxial region over a substrate, forming a dielectric pillar between the p-type epitaxial region and the n-type epitaxial region, depositing sacrificial liners around both the p-type epitaxial region and the n-type epitaxial region, and depositing an inter-layer dielectric (ILD). The method further includes forming trenches in the ILD extending into the sacrificial liners, wherein the trenches are vertically aligned with the p-type epitaxial region and the n-type epitaxial region, removing the sacrificial liners to define irregular-shaped openings exposing the p-type epitaxial region and the n-type epitaxial region, and filling the irregular-shaped openings with a conductive material defining the wrap around contact.

20 Claims, 11 Drawing Sheets

(51) Int. Cl.
*H01L 29/66* (2006.01)
*H01L 29/78* (2006.01)

(58) Field of Classification Search
CPC ............... H01L 23/485; H01L 29/6681; H01L 29/6653; H01L 29/66545; H01L 21/76897
See application file for complete search history.

(56) References Cited

U.S. PATENT DOCUMENTS

| | | |
|---|---|---|
| 9,847,390 B1 | 12/2017 | Xie et al. |
| 10,074,727 B2 | 9/2018 | Adusumilli et al. |
| 10,084,094 B1 | 9/2018 | Cheng et al. |
| 10,192,819 B1 | 1/2019 | Chanemougame et al. |
| 10,192,867 B1 | 1/2019 | Frougier et al. |
| 10,236,218 B1 | 3/2019 | Xie et al. |
| 2015/0325646 A1* | 11/2015 | Lai .................... H01L 21/02521 257/369 |
| 2017/0018464 A1* | 1/2017 | Kim ................ H01L 21/823821 |
| 2018/0233412 A1* | 8/2018 | Xie ................. H01L 21/823425 |
| 2018/0269306 A1 | 9/2018 | Bao et al. |
| 2018/0374958 A1 | 12/2018 | Guillorn et al. |
| 2019/0267374 A1* | 8/2019 | Hung .............. H01L 21/823437 |

\* cited by examiner

WRAP AROUND CONTACT PROCESS MARGIN IMPROVEMENT WITH EARLY CONTACT CUT

BACKGROUND

The present invention relates generally to semiconductor devices, and more specifically, to a wrap-around-contact (WAC) process margin improvement with early trench contact (TS) cut.

While the planar field effect transistor (FET) appears to have reached the end of its scalable lifespan, the semiconductor industry has found an alternative approach with finFETs. FinFET technology is viewed as a suitable choice for next generation advanced processes due to its superior short channel control and area scaling benefits. To achieve better performance, contact optimization over the source/drain (S/D) epitaxy is needed, especially for FinFET technology and other technologies beyond FinFET, such as nanosheet, where the S/D epi can be tall, and a wrap around contact which contacts not only the top and also the sidewall surfaces of the S/D epi is needed to maximize the contact area and reduce the contact resistance. However, forming such contact could have very small process margin.

SUMMARY

In accordance with an embodiment, a method is provided for forming a wrap around contact. The method includes forming a p-type epitaxial region and an n-type epitaxial region over a substrate, forming a dielectric pillar between the p-type epitaxial region and the n-type epitaxial region, depositing sacrificial liners around both the p-type epitaxial region and the n-type epitaxial region, depositing an inter-layer dielectric (ILD), forming trenches in the ILD extending into the sacrificial liners, wherein the trenches are vertically aligned with the p-type epitaxial region and the n-type epitaxial region, removing the sacrificial liners to define irregular-shaped openings exposing the p-type epitaxial region and the n-type epitaxial region, and filling the irregular-shaped openings with a conductive material defining the wrap around contact.

In accordance with another embodiment, a method is provided for forming a wrap around contact. The method includes forming a dielectric pillar between a first epitaxial region and a second epitaxial region, depositing sacrificial liners around the first and second epitaxial regions, depositing an inter-layer dielectric (ILD), forming trenches in the ILD extending above the first and second epitaxial regions, removing the sacrificial liners to define openings exposing the first and second epitaxial regions, and filling the openings with a conductive material defining the wrap around contact.

In accordance with yet another embodiment, a semiconductor device is provided. The semiconductor device includes a p-type epitaxial region and an n-type epitaxial region disposed over a substrate, a dielectric pillar disposed between the p-type epitaxial region and the n-type epitaxial region, wherein the dielectric pillar extends above topmost surfaces of the p-type epitaxial region and an n-type epitaxial region, and an irregular-shaped wrap around electrode directly contacting sidewalls and the topmost surfaces of the p-type epitaxial region and the n-type epitaxial region.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for forming wrap-around-contacts (WACs). Contact resistance is a contributor of the total resistance of a transistor as transistor device scaling continues beyond (e.g., below) the 10 nanometer (nm) technology node. The term "contact resistance" is a measure of the ease with which current can flow across a metal-semiconductor interface. Contact resistivity (RhoC) reduction alone is not enough to reduce external resistance to its target for 10 nm technology node and beyond, and a new contact structure is needed to increase the contact area. The WAC can be considered an ideal contact structure for 3D finFETs. However, the WAC has been difficult to achieve during certain semiconductor manufacturing processes.

Embodiments in accordance with the present invention provide techniques and processes for constructing WACs surrounding source/drain epitaxial regions to increase contact area, and, thus, reduce contact resistance. The exemplary embodiments of the present invention form a source/drain contact cut early with a liner-based WAC.

Examples of semiconductor materials that can be used in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
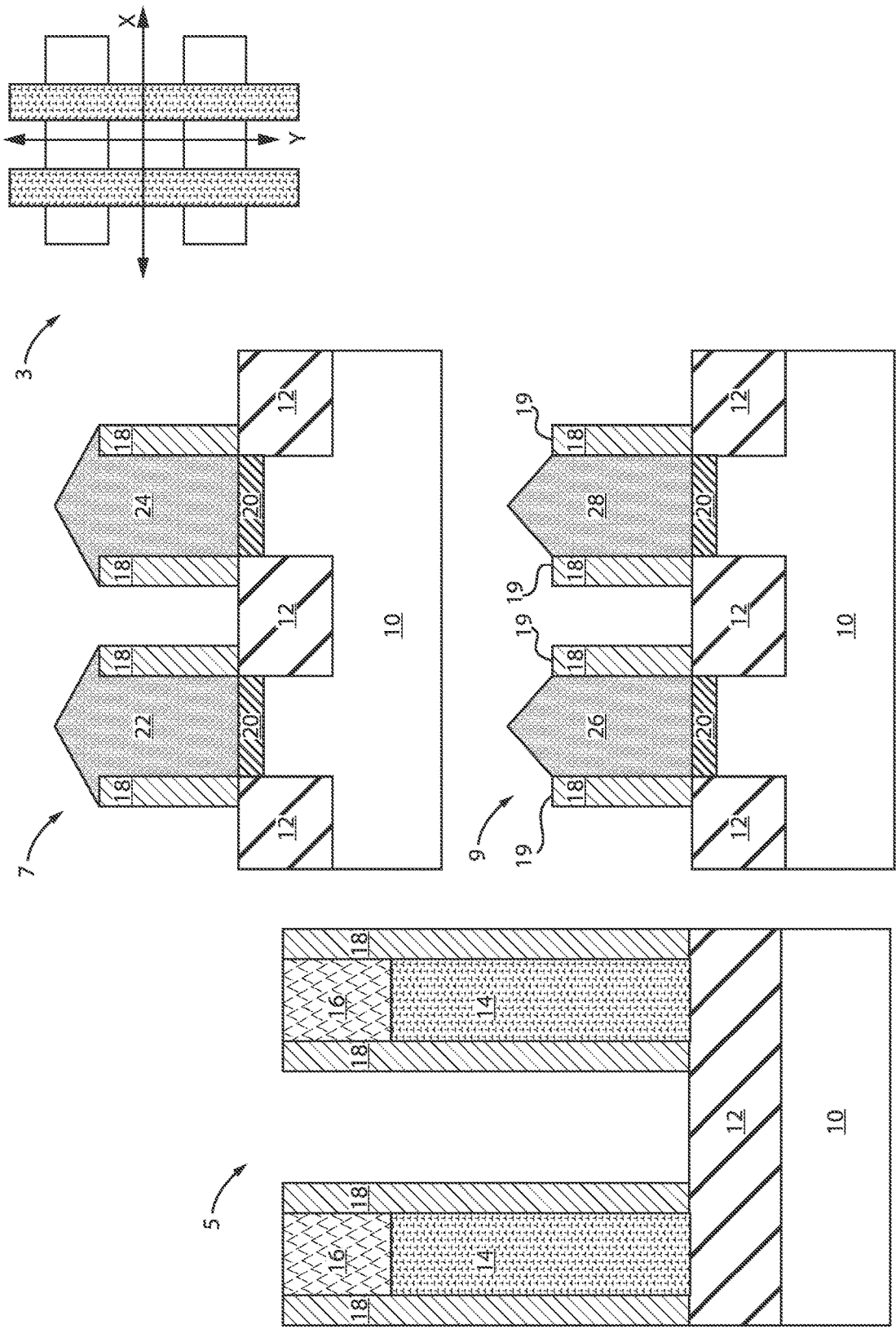
FIG. 1 is a cross-sectional view of a semiconductor structure where source/drain (S/D) epitaxial formation takes place, in accordance with an embodiment of the present invention.

FIG. 1 is a cross-sectional view of a semiconductor structure where source/drain (S/D) epitaxial formation takes place, in accordance with an embodiment of the present invention.

A semiconductor structure 5, which corresponds to the X-cut of top view 3, includes a semiconductor substrate 10. A dielectric 12 is formed over the semiconductor substrate 10. The dielectric 12 can be shallow trench isolation (STI) regions 12.

Dummy gates 14 can be formed over the STI regions 12. A hardmask 16 can be formed over the dummy gates 14. Spacers 18 are formed adjacent the dummy gates 14 and the hardmasks 16.

In structure 7, which corresponds to the Y-cut of top view 3, source/drain epitaxial regions 22, 24 can be formed over Black Diamond I (BDI) layers 20. The source/drain epitaxial regions 22, 24 directly contact spacers 18. The source/drain epitaxial regions 22, 24 also directly contact the upper surface of the spacers 18.

In structure 9, which corresponds to the Y-cut of top view 3, the source/drain epitaxial regions 22, 24 are trimmed to expose a top surface 19 of the spacers 18. The S/D epitaxial formations or regions 26, 28 remain between the spacers 18. The epitaxial region 26 can be an n-type epitaxial region or n-type epi and the epitaxial region 28 can be a p-type epitaxial region or p-type epi.

A top view 3 of the structure is also illustrated. Structure 5 corresponds to the X-cut in top view 3 and structures 7, 9 correspond to the Y-cut in top view 3.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

Dummy gate 14 materials include, but are not limited to, a thin layer of dummy oxide $SiO_2$ followed by any one or more of amorphous or polycrystalline Si, $SiO_2$, SiON, SiGe, Ge, $GeO_2$, amorphous C, BC, CN, etc.

In various embodiments, the hardmask layer 16 can be a nitride, for example, a silicon nitride (SiN), an oxynitride, for example, silicon oxynitride (SiON), or a combination thereof. The capping materials 16 can include any one or more of SiN, SiCN, SiBN and/or SiBCN, among other materials. In a preferred embodiment, the hardmask layer 16 can be silicon nitride (SiN), for example, $Si_3N_4$.

In one or more embodiments, the hardmask layer 16 can have a thickness in the range of about 10 nm to about 100 nm, or in the range of about 35 nm to about 75 nm, or in the range of about 45 nm to about 55 nm, although other thicknesses are contemplated.

The spacers 18 can be composed of any one or more of SiN, SiBN, SiCN, SiOC, SiOCN and/or SiBCN films.

The BDI layers 20 are dense, silicon-oxide-based chemical vapor deposition (CVD) low-k nitride materials with an approximate k-value of just under 7.0.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Source/drain epitaxial regions 26, 28 can be of the same or different materials for pFET and nFET devices, and can be either in-situ doped with appropriate polarity dopants (B for pFET and P for nFET devices) or doped by ion implantation.

Examples of various epitaxial growth process apparatus that are suitable for use in one or more embodiments include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a carbon containing gas source, or a combination thereof. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

Figure 2:
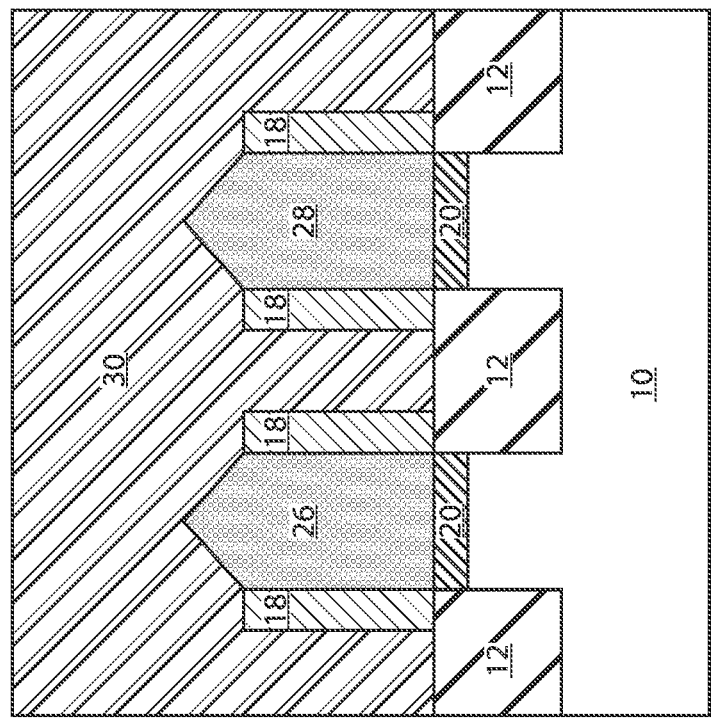
FIG. 2 is a cross-sectional view of the semiconductor structure of FIG. 1 where an organic planarization layer (OPL) is deposited, in accordance with an embodiment of the present invention.
Figure 2:
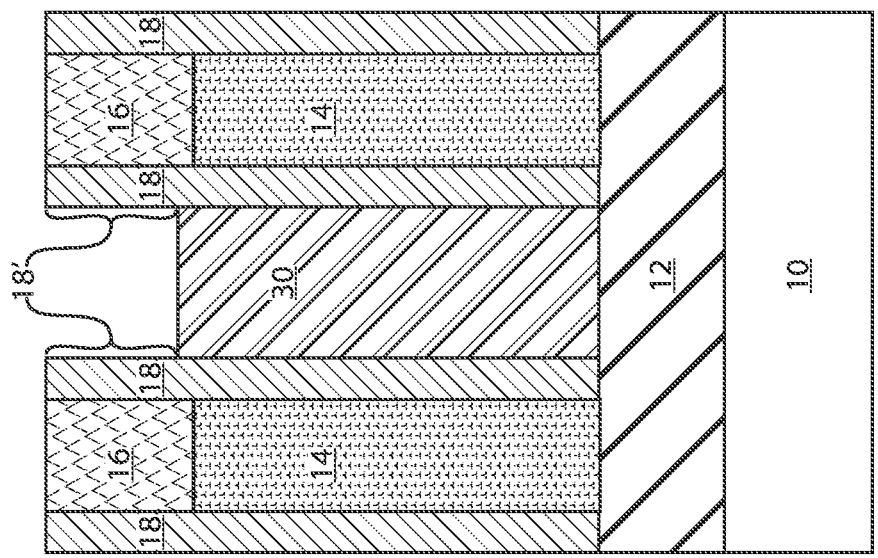

FIG. 2 is a cross-sectional view of the semiconductor structure of FIG. 1 where an organic planarization layer (OPL) is deposited, in accordance with an embodiment of the present invention.

In various example embodiments, an organic planarization layer (OPL) 30 is deposited followed by an OPL recess. The OPL 30 directly contacts the top surfaces of the S/D epitaxial regions 26, 28. The OPL 30 directly contacts side surfaces or sidewalls of the spacers 18, such that spacers portions 18' remain exposed.

The OPL 30 can be formed at a predetermined thickness to provide reflectivity and topography control during etching of the layers below. The OPL 30 can include an organic material, such as a polymer. The thickness of the OPL 30 can be in a range from about 10 nm to about 300 nm. In one example, the thickness of the OPL 30 is about 100 nm-150 nm.

Figure 3:
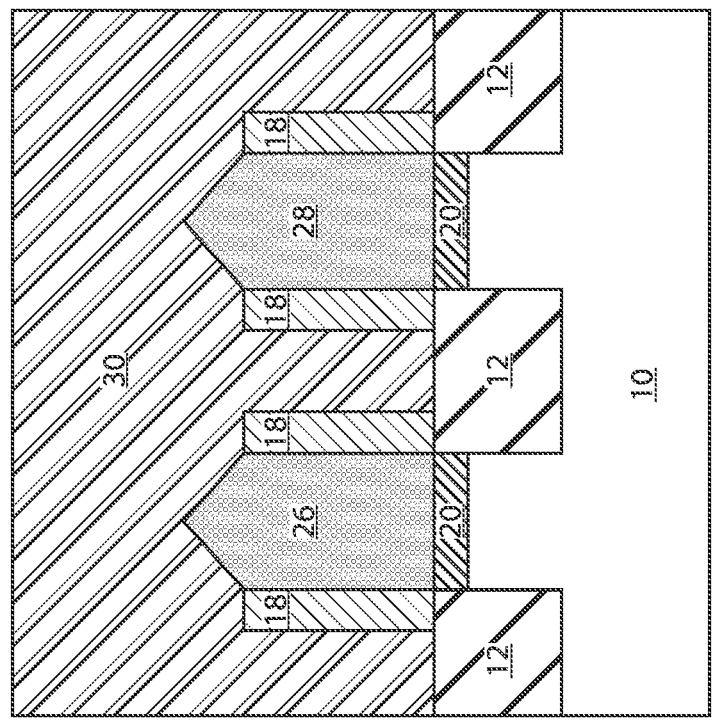
FIG. 3 is a cross-sectional view of the semiconductor structure of FIG. 2 where a top section of the nitride spacers is trimmed and silicon carbide (SiC) spacers are formed, in accordance with an embodiment of the present invention.
Figure 3:
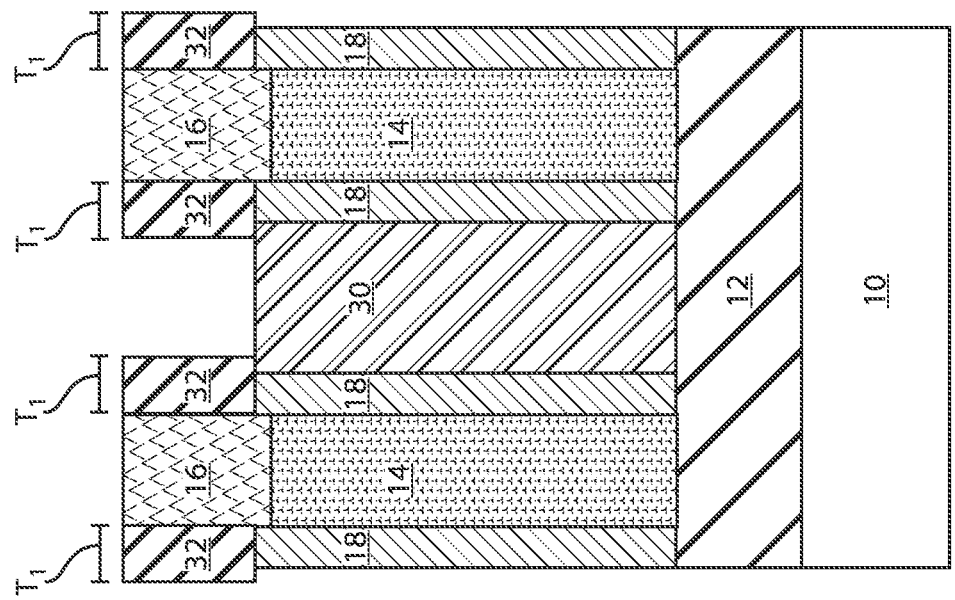

FIG. 3 is a cross-sectional view of the semiconductor structure of FIG. 2 where a top section of the nitride spacers is selectively etched and silicon carbide (SiC) spacers are formed, in accordance with an embodiment of the present invention.

In various example embodiments, a top section of the nitride spacers 18 is removed and silicon carbide (SiC) spacers 32 are formed. The SiC spacers 32 have a thickness "T1" that is equal or greater than the thickness of the remaining spacers 18.

Figure 4:
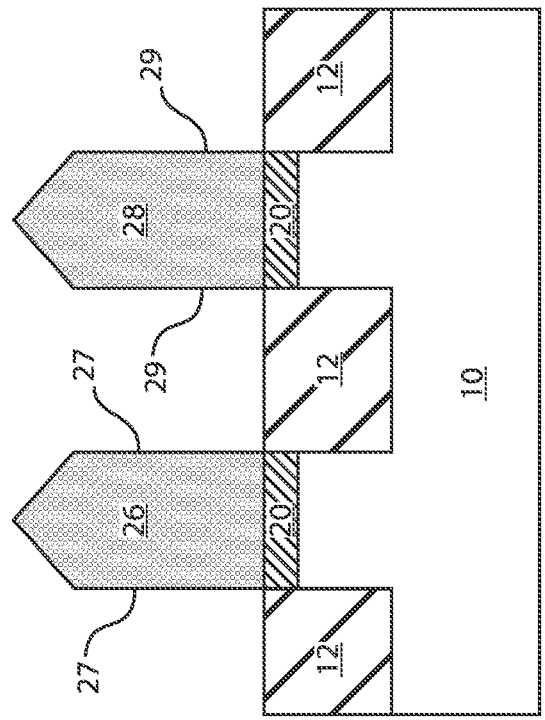
FIG. 4 is a cross-sectional view of the semiconductor structure of FIG. 3 where the OPL is removed and the spacer at the sidewall of the epi, which is not covered by spacer 32, is etched down using an anisotropic etch, in accordance with an embodiment of the present invention.
Figure 4:
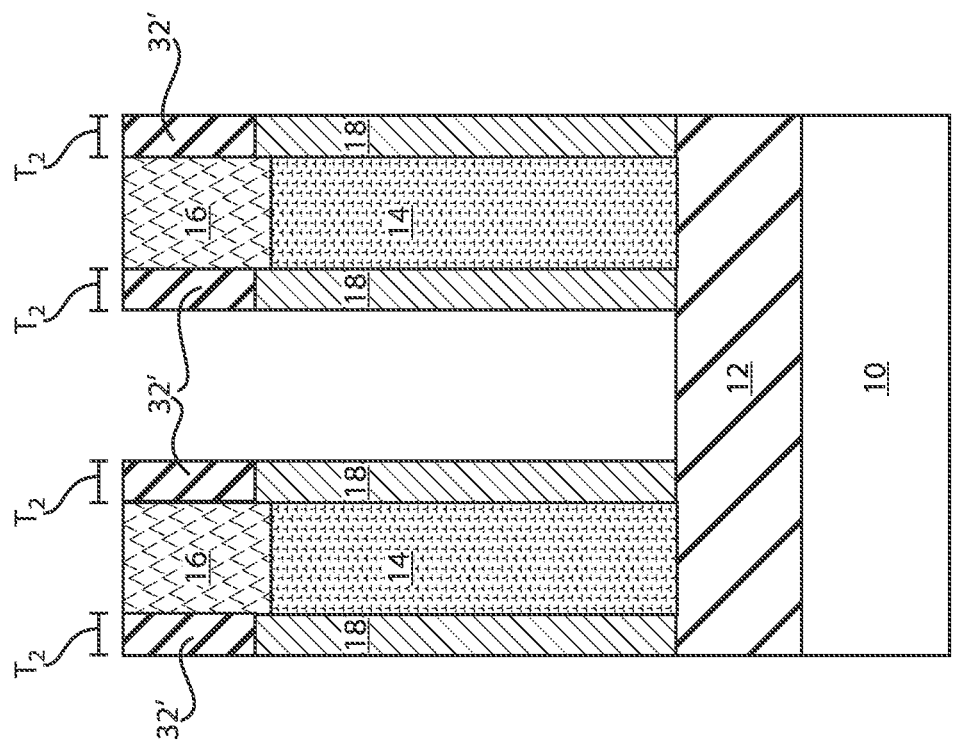

FIG. 4 is a cross-sectional view of the semiconductor structure of FIG. 3 where the OPL is removed and the spacer at the sidewall of the epi, which is not covered by spacer 32, is etched down using an anisotropic etch, in accordance with an embodiment of the present invention.

In various example embodiments, the OPL 30 is removed, the nitride spacers 18 are removed from the S/D epitaxial regions 26, 28. The removal of the nitride spacers 18 exposes the sidewalls 27, 29 of S/D epitaxial regions 26, 28, respectively. Additionally, the SiC spacers 32' can be trimmed and now have a thickness "T2," which is equal to the thickness T1. In one example, a distance between the n-type epi region 26 and the p-type epi region 28 is about 30 nm.

Figure 5:
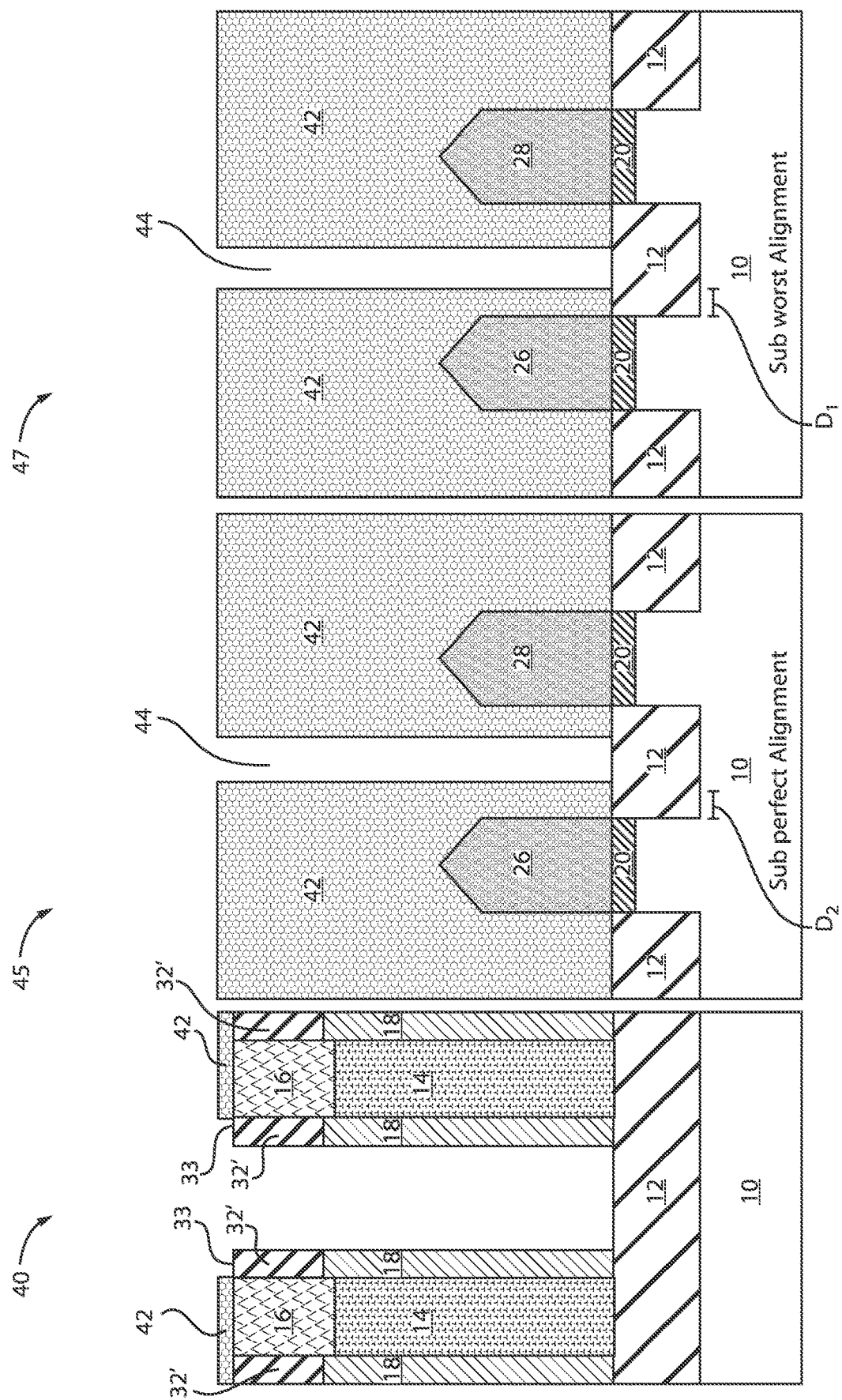
FIG. 5 is a cross-sectional view of the semiconductor structure of FIG. 4 where another OPL is deposited and trenches are lithographically patterned and etched between the S/D epitaxial formations, in accordance with an embodiment of the present invention.

FIG. 5 is a cross-sectional view of the semiconductor structure of FIG. 4 where another OPL is deposited and trenches are lithographically patterned and etched between the S/D epitaxial formations, in accordance with an embodiment of the present invention.

In various example embodiments, an OPL 42 is deposited. In structure 40, the OPL 42 directly contacts a top surface of the hardmask 16 and directly contacts a top surface of some of the SiC spacers 32'. A top surface 33 of other SiC spacers 32' remains exposed.

In structures 40, 45, 47, a cut or trench 44 is formed in OPL 42 such that the trench 44 extends between the S/D epitaxial regions 26, 28. The trench is also between the two gate spacers 18. The trench 44 extends to a top surface of an STI region 12. In structure 45, a thickness "$D_1$" of the OPL 42 is equal on opposed ends of the trench 44. In other words, the trench 44 is formed directly in the middle of the S/D epitaxial regions 26, 28. However, in structure 47, the thickness "$D_2$" of the OPL 42 is not equal on opposed ends of the trench 44. In other words, the trench 44 is not formed directly in the middle of the S/D epitaxial regions 26, 28. Thus, in structure 45, there is perfect alignment, whereas structure 47 illustrates worst case scenario alignment. In other words, the OPL 42 in structure 47, adjacent the n-type epitaxial region 26 is thinner than the OPL 42 in structure 45, adjacent the n-type epitaxial region 26.

Thus, ideally, the trench 44 would be exactly in the middle of the OPL 42 such that an equal amount of OPL remains adjacent the S/D epitaxial regions 26, 28. However, this is not always the case. As such, in actual applications, the trench 44 can be vertically offset from a center or midpoint location such that one side of the S/D epitaxial regions 26, 28 contacts a thinner and/or thicker portion or section or area of OPL 42 due to random misalignment during lithography.

In some applications, a wrap around contact layer is formed around the S/D epi first followed by a TS cut, assuming the CD for the TS cut (or trench 44) has a width of about 16 nm. Even at zero misalignment and critical dimension uniformity (CDU) variation, the space between the TS cut and the wrap around contact layer can be about 3 nm. Thus, if the CDU plus the misalignment error is greater than 3 nm, then the TS cut can, in certain instances, touch the wrap around contact layer, which can cause damage to the wrap around contact. However, FIGS. 6-11 below illustrate how such a situation can be prevented. In other words, making the TS cut without damaging the wrap around contact over the n-type epi region 26.

The cut or etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

Figure 6:
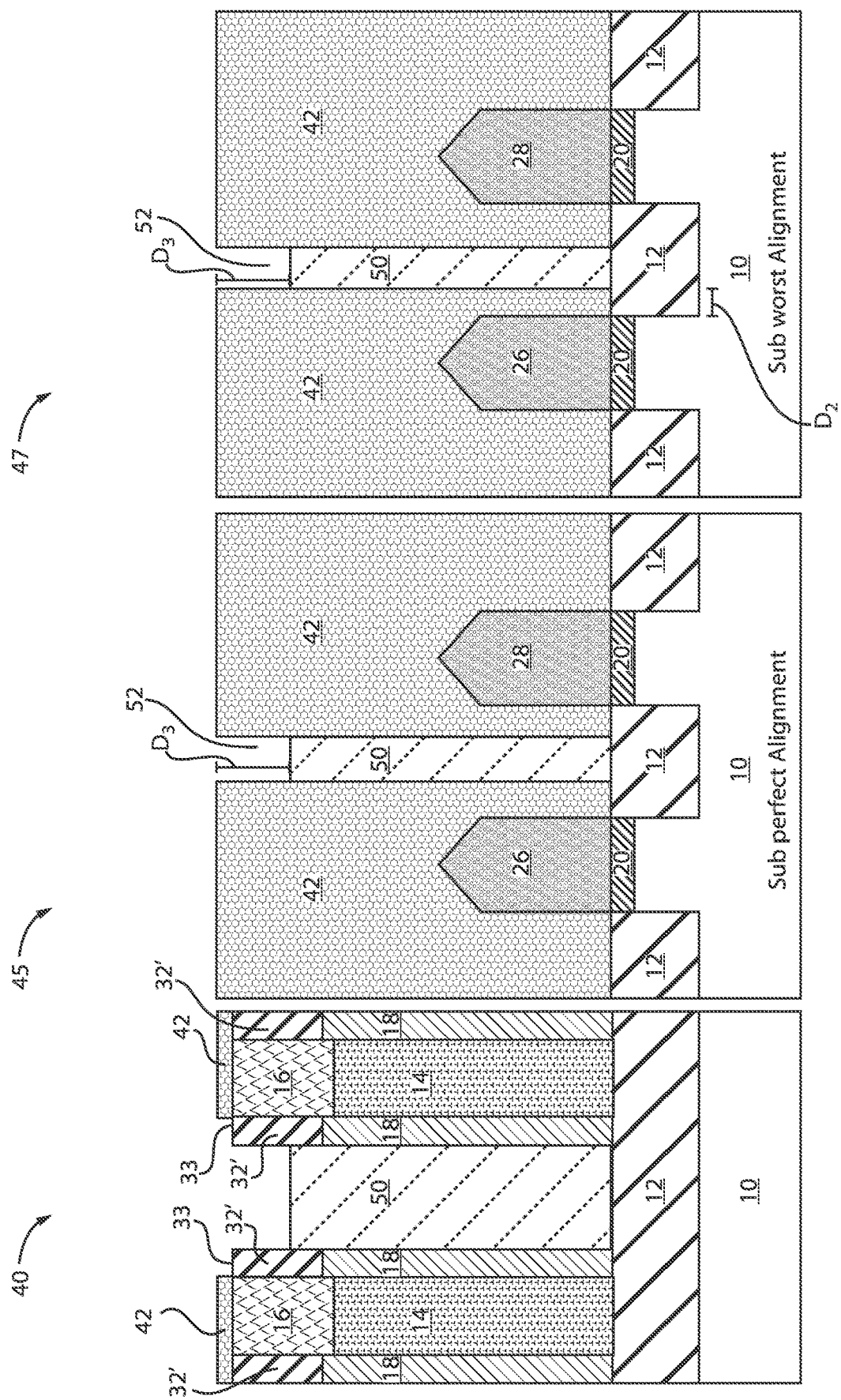
FIG. 6 is a cross-sectional view of the semiconductor structure of FIG. 5 where a dielectric fill takes place, in accordance with an embodiment of the present invention.

FIG. 6 is a cross-sectional view of the semiconductor structure of FIG. 5 where a dielectric fill takes place, in accordance with an embodiment of the present invention.

In various example embodiments, a dielectric 50 is deposited. The dielectric 50 can also be referred to as a dielectric pillar 50.

In structure 40, the dielectric 50 is deposited between the dummy gates 14.

In structures 45, 47, the dielectric 50 is deposited in the trenches 44 between the S/D epitaxial regions 26, 28. After dielectric deposition, a dielectric recess is applied, and an opening 52 remains over the dielectric 50. The opening 52 can extend a distance $D_3$ into the OPL 42. The dielectric pillar 50 extends above the topmost surfaces of the p-type epitaxial region 26 and the n-type epitaxial region 28.

The dielectric 50 can include, but is not limited to, SiN, SiOCN, SiC, SiOC, SiBCN, $SO_2$, $SiO_2$, or ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 10.

In some embodiments, the dielectric 50 can be conformally deposited using atomic layer deposition (ALD) or, chemical vapor deposition (CVD). Variations of CVD processes suitable for forming the dielectric 50 include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

Figure 7:
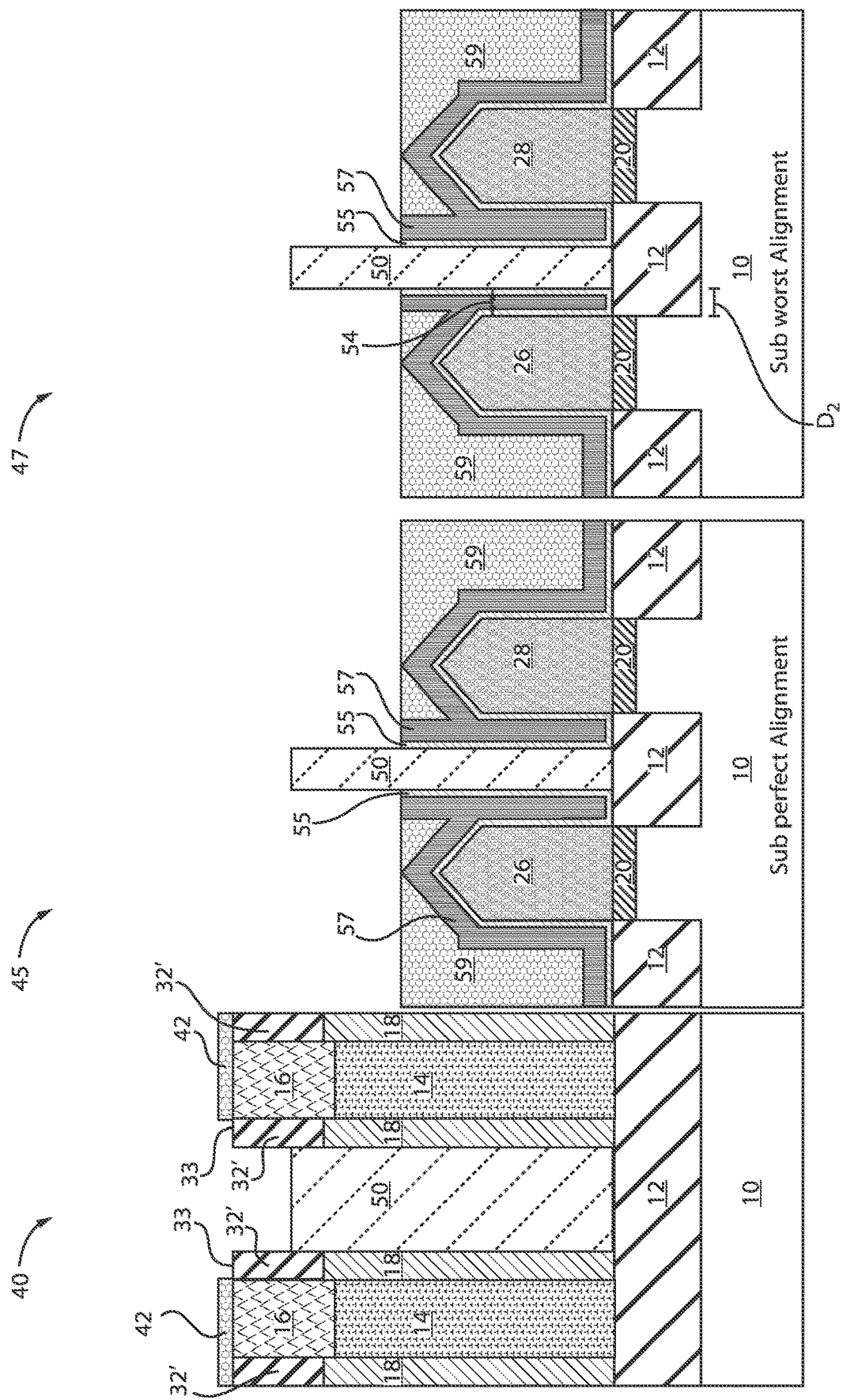
FIG. 7 is a cross-sectional view of the semiconductor structure of FIG. 6 where the OPL is removed and a dielectric layer and a sacrificial layer are deposited over the S/D epitaxial formations, in accordance with an embodiment of the present invention.

FIG. 7 is a cross-sectional view of the semiconductor structure of FIG. 6 where the OPL is removed and a dielectric layer and a sacrificial layer are deposited over the S/D epitaxial formations, in accordance with an embodiment of the present invention.

In various example embodiments, in structures 45, 47, the OPL 42 is removed. A dielectric layer 55, a sacrificial layer 57, and an OPL 59 are then deposited. The dielectric layer 55 directly contacts the S/D epitaxial regions 26, 28. The dielectric 55 also directly contacts sidewalls of the dielectric pillar 50. A top portion of the dielectric pillar 50 remains exposed. The sacrificial layer 57 directly contacts the dielectric layer 55. The OPL 59 directly contacts the sacrificial layer 57. Moreover, even in a worst case misalignment, there is still space between the n-type epitaxial region 26 and the dielectric 50 for receiving the dielectric layer 55 and the sacrificial layer 57. The OPL 59 can be recessed by dry etch, followed by removal of the sacrificial layer and the dielectric layer exposed on top.

In one example, the dielectric layer 55 can be, e.g., $SiO_2$ and the sacrificial layer 57 can be, e.g., titanium nitride (TiN). The total thickness of the dielectric layer 55 and the sacrificial layer 57 can be about 4 to 15 nm. The dielectric layer 55 can also be any suitable dielectric such as, for example, silicon oxide (SiO), silicon nitride (SiN), silicon oxynitride, silicon boron carbon nitride (SiBCN), silicon oxygen carbon nitride (SiOCN), silicon oxygen carbon (SiOC), silicon carbon nitride (SiCN), hydrogenated oxidized silicon carbon (SiCOH), or any suitable combination of those materials.

Figure 8:
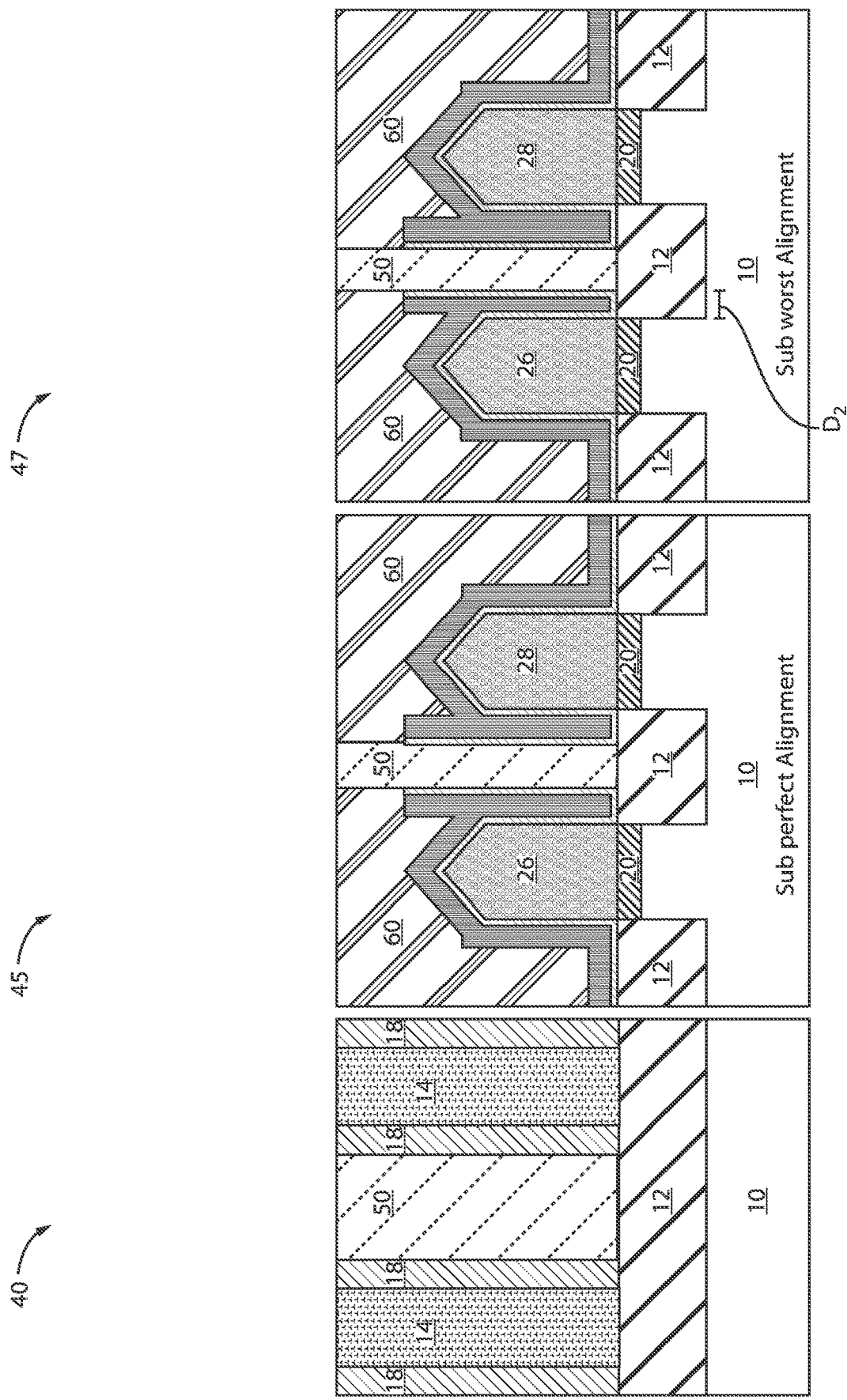
FIG. 8 is a cross-sectional view of the semiconductor structure of FIG. 7 where an inter-layer dielectric (ILD) is deposited and chemical-mechanical planarization (CMP) is performed, in accordance with an embodiment of the present invention.

FIG. 8 is a cross-sectional view of the semiconductor structure of FIG. 7 where an inter-layer dielectric (ILD) is deposited and chemical-mechanical planarization (CMP) is performed, in accordance with an embodiment of the present invention.

In various example embodiments, in structures 45, 47, the OPL 59 is removed and an inter-layer dielectric (ILD) 60 is deposited over the sacrificial layers 55, 57. A chemical-mechanical planarization (CMP) is also performed.

The ILD 60 can be any suitable dielectric such as, for example, silicon oxide (SiO), silicon nitride (SiN), silicon oxynitride, silicon boron carbon nitride (SiBCN), silicon oxygen carbon nitride (SiOCN), silicon oxygen carbon (SiOC), silicon carbon nitride (SiCN), hydrogenated oxidized silicon carbon (SiCOH), or any suitable combination of those materials. In one example, the ILD 60 can be a low-k oxide.

The ILD 60 directly contacts the sacrificial layer 57. The ILD 60 further directly contacts the sidewalls of the exposed dielectric pillar 50. The CMP extends to a top surface of the dielectric pillar 50, such that a top surface of the dielectric pillar 50 remains exposed.

Figure 9:
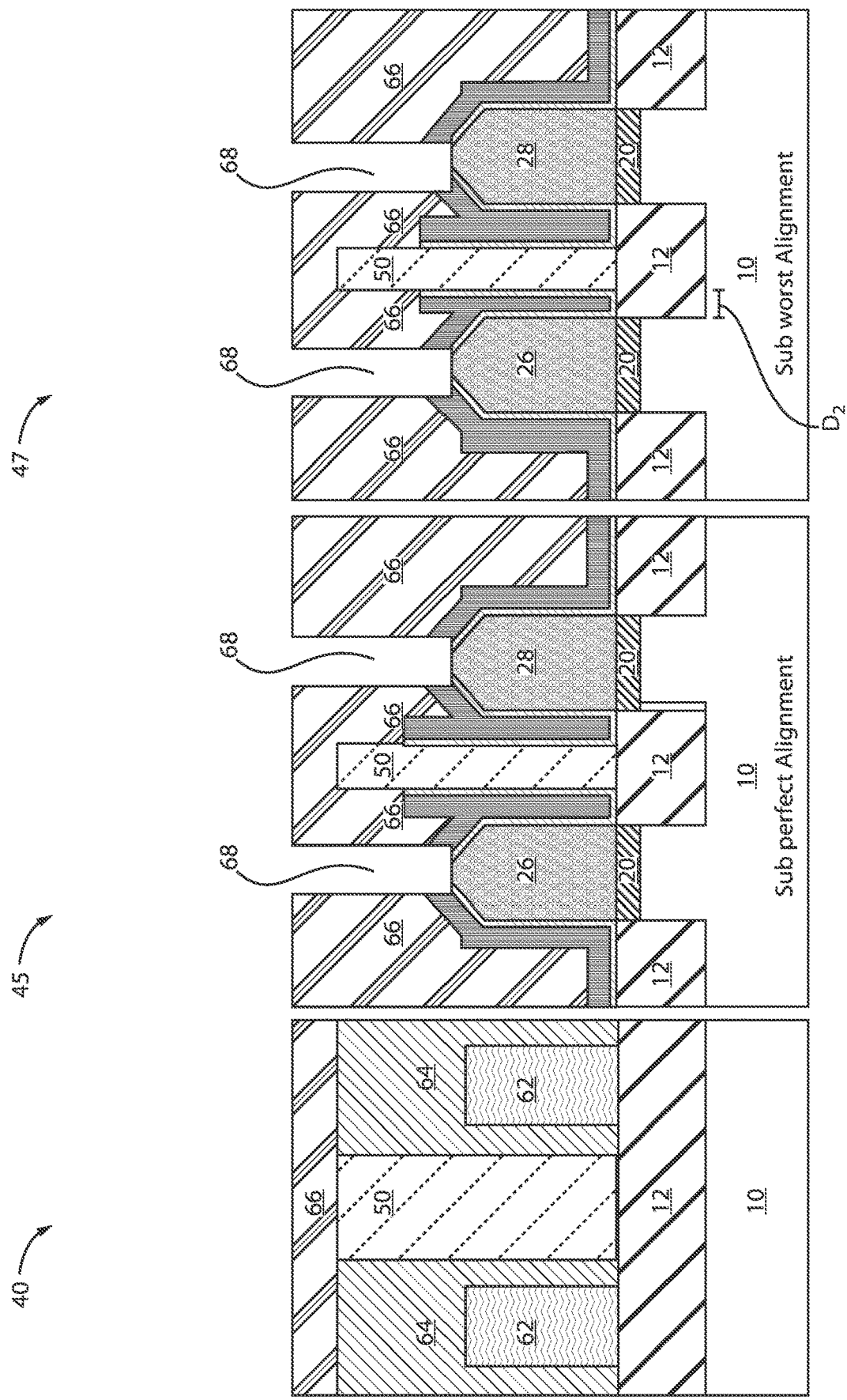
FIG. 9 is a cross-sectional view of the semiconductor structure of FIG. 8 where a replacement metal gate is formed, another ILD is deposited, and trenches are formed over the S/D epitaxial formations, in accordance with an embodiment of the present invention.

FIG. 9 is a cross-sectional view of the semiconductor structure of FIG. 8 where a replacement metal gate is formed, another ILD is deposited, and trenches are formed over the S/D epitaxial formations, in accordance with an embodiment of the present invention.

In various example embodiments, in structure 40, a replacement metal gate (RMG) is formed. In particular, the dummy gates 14 are removed, a high-k metal gate (HKMG) 62 is deposited, and a self-aligned cap (SAC) 64 is formed to surround the HKMG 62. A middle-of-the-line (MOL) ILD 66 is further deposited.

The dummy gates 14 can be removed by implementing a reactive ion etch (RIE) process and/or a wet etching process. If the dummy gates 14 are made of amorphous or poly-Si, the dummy gates 14 can be etched in hot $NH_4OH$ or Tetramethylammonium hydroxide (TMAH) chemistries in a manner that is selective to the spacers 18.

Replacement gates 62 are formed in regions or openings of the device structure previously occupied by the dummy gates 14. In one example, a high-k material and a work function metal can be deposited. The high-k material can be any of the materials $HfO_x$, $HfSiO_x$, $Al_2O_3$, $ZrO_2$, $ZrSiO_x$, among other materials. The work function material can include any of the following metal compounds TiN, TaN, TiC, TaC, $La_2O_3$, Al, $AlO_x$, among other materials. Both high-k and work function metals can be deposited by PVD, CVD or ALD processes.

The SAC 64 can be, e.g., silicon nitride or carbon-doped silicon nitride.

In structures 45, 47, trenches 68 are further formed in the MOL ILD 66. The trenches 68 are formed over the S/D epitaxial regions 26, 28. The trenches 68 do not directly contact the S/D epitaxial regions 26, 28. The trenches 68 either contact the dielectric layer 55 or the sacrificial layer 57. Stated differently, the trenches 68 contact one or more of the sacrificial layers 55, 57.

Figure 10:
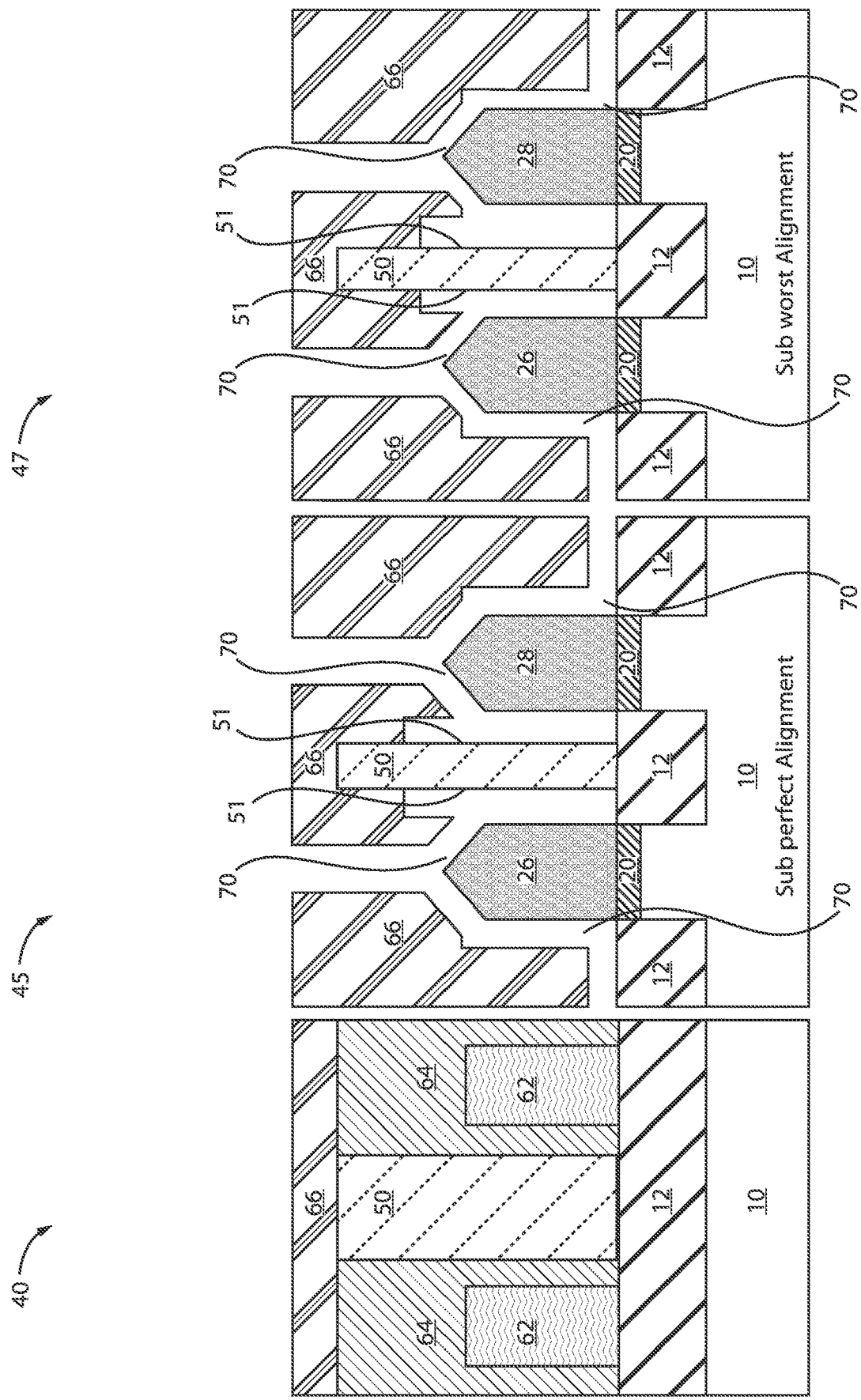
FIG. 10 is a cross-sectional view of the semiconductor structure of FIG. 9 where the dielectric layer and the conductive layer are removed to expose the S/D epitaxial formations, in accordance with an embodiment of the present invention.

FIG. 10 is a cross-sectional view of the semiconductor structure of FIG. 9 where the dielectric layer and the conductive layer are removed to expose the S/D epitaxial formations, in accordance with an embodiment of the present invention.

In various example embodiments, in structures 45, 47, the dielectric layer 55 and the sacrificial layer 57 are removed to expose the S/D epitaxial regions 26, 28. An opening 70 extends around the S/D epitaxial regions 26, 28. The opening 70 can be referred to as an irregular-shaped opening 70. Additionally, sidewalls 51 of the dielectric 50 are also exposed.

Figure 11:
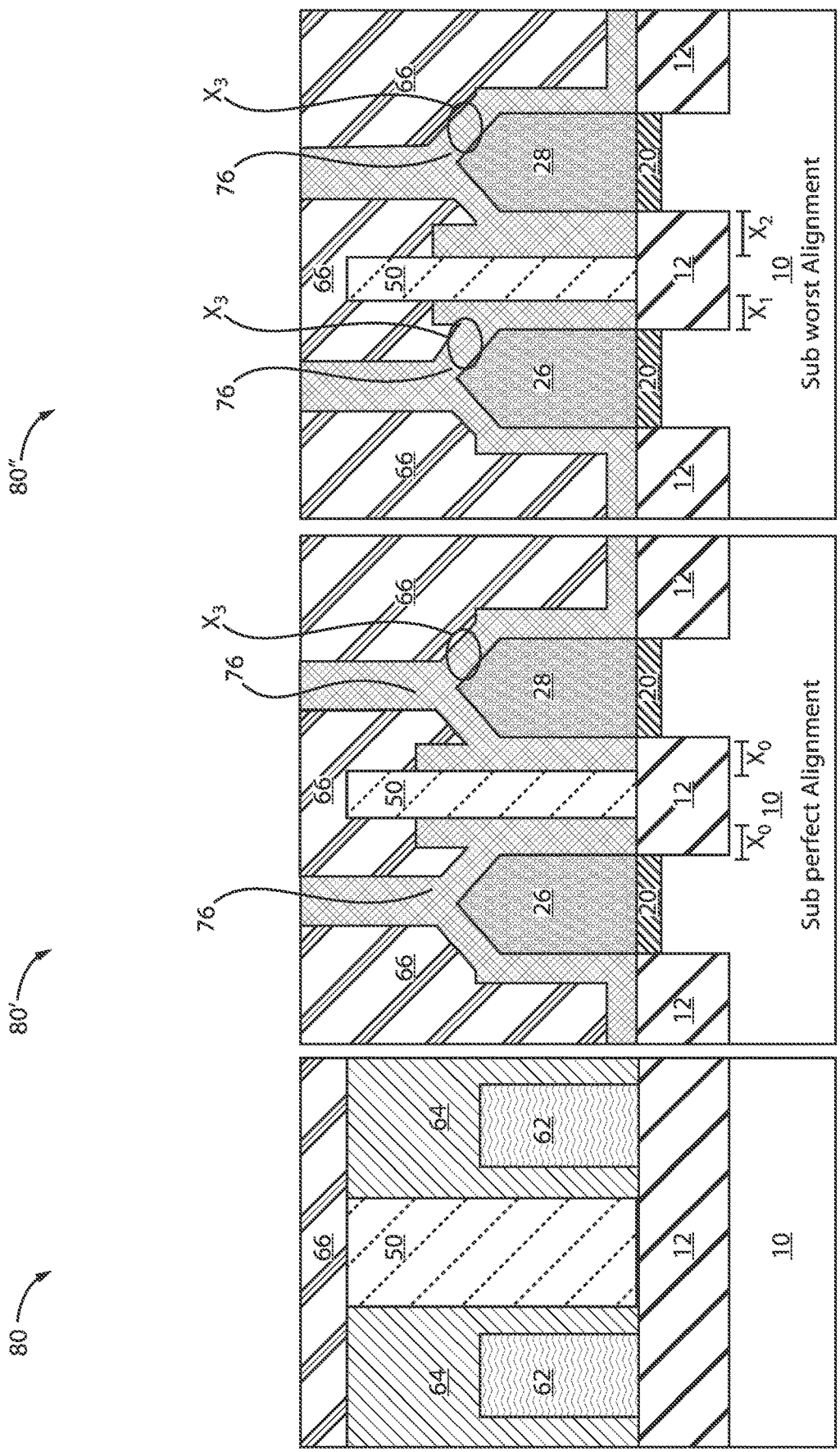
FIG. 11 is a cross-sectional view of the semiconductor structure of FIG. 10 where a wrap around contact is formed surrounding the S/D epitaxial formations, in accordance with an embodiment of the present invention.

FIG. 11 is a cross-sectional view of the semiconductor structure of FIG. 10 where a wrap around contact is formed surrounding the S/D epitaxial formations, in accordance with an embodiment of the present invention.

In various example embodiments, in structures 80', 80", a wrap around contact (WAC) 76 is formed surrounding the S/D epitaxial regions 26, 28. The WAC 76 can have an equal thickness $x_o$ on opposed ends of the dielectric pillar 50 (structure 80'). In another embodiment, the WAC 76 can have different thicknesses ($x_1$, $x_2$) on opposed ends of the dielectric pillar 50 (structure 80"). For example, thickness $x_2$ can be greater than thickness $x_1$. Also, the thickness $x_3$ of the contact 76 above the S/D epitaxial regions 26, 28 can be greater than the thicknesses $x_1$ and $x_2$. Thus, the thickness of the WAC 76 around the S/D epitaxial regions 26, 28 can vary or be non-uniform.

Structure 80 merely illustrates the SAC 64 over the HKMG 62.

The WAC 76 can be formed using a process such as CVD, PVD, ALD, or electroplating processes or some combination of these processes. The WAC 76 can include a conductive material. The conductive material can include, but is not limited to, titanium, cobalt, tungsten, copper, aluminum, silver, gold and alloys thereof.

In summary, the device structure of the exemplary embodiments of the present invention includes an upper contact with smaller critical dimension (CD) compared to a bottom contact, a lower contact with larger size which wraps around the epi, where the lower contact thickness is substantially uniform except for the region that the contact is cut (the contact becomes discontinuous or non-uniform), and a dielectric pillar between the discontinuous (varying in thickness) contact, where the thickness of the contact close to the dielectric pillar could be slightly less or larger than the thickness above the epi. An overhung metal liner can further abut the dielectric pillar.

In summary, the method of the exemplary embodiments of the present invention includes forming S/D epi, forming a contact cut dielectric pillar, forming a sacrificial liner around the epi, removing the sacrificial liner from a top region of the pillar sidewall, forming an ILD over the sacrificial liner, forming a contact trench over the sacrificial liner, removing sacrificial liner, and forming a wrap around contact.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties can include doping, such as doping transistor sources and drains, generally by diffusion and/or by ion implantation. These doping processes are followed by furnace annealing or by rapid thermal annealing (RTA). Annealing serves to activate the implanted dopants.

The dry and wet etching processes employed in the exemplary embodiments can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as deep reactive-ion etching (DRIE). Chemical vapor etching can be used as a selective etching method, and the etching gas can include hydrogen chloride (HCl), $CF_4$, and gas mixture with hydrogen ($H_2$). Chemical vapor etching can be performed by CVD with suitable pressure and temperature.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a wrap around contact (WAC) process margin with early trench contact (TS) cut (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor structure comprising:
a p-type epitaxial region and an n-type epitaxial region disposed over a substrate;
a dielectric pillar disposed between the p-type epitaxial region and the n-type epitaxial region; and
a respective wrap around contact on each of the p-type epitaxial region and n-type epitaxial region, wherein a central via portion of the each wrap around contact extends above a top surface of the dielectric pillar and onto the respective p-type epitaxial region and n-type epitaxial region, with a wrap around portion that is offset from the central via portion and that extends atop the top surface of the respective p-type epitaxial region and n-type epitaxial region, the central via portion having a greater thickness than a sidewall portion of the wrap around contact that is present on sidewalls of the respective p-type epitaxial region and n-type epitaxial region, and wherein a sidewall extension portion of each wrap around contact extends vertically above the sidewall portion of the wrap around contact in contact with the dielectric pillar.

2. The semiconductor structure of claim 1, wherein the wrap around contact is an irregular-shaped wrap around contact.

3. The semiconductor structure of claim 1, wherein a wrap around contact section adjacent the n-type epitaxial region has a different width than a wrap around contact section adjacent the p-type epitaxial region.

4. The semiconductor structure of claim 1, wherein the dielectric pillar extends above topmost surfaces of the p-type epitaxial region and the n-type epitaxial region.

5. The semiconductor structure of claim 1, wherein the wrap around contact directly contacts sidewalls and topmost surfaces of the p-type epitaxial region and the n-type epitaxial region.

6. The semiconductor structure of claim 1, wherein an upper portion of the wrap around contact has a smaller critical dimensions (CD) than a lower portion of the wrap around contact.

7. The semiconductor structure of claim 6, wherein the lower portion of the wrap around contact is substantially uniform.

8. The semiconductor structure of claim 6, wherein a thickness of the lower portion of the wrap around contact is less than a thickness of the p-type epitaxial region and the n-type epitaxial region.

9. The semiconductor structure of claim 1, wherein a distance between a sidewall of the n-type epitaxial region and a sidewall of the dielectric pillar is at least 3 nm but less than 30 nm.

10. The semiconductor structure of claim 1, wherein a bottom surface of the wrap around contact directly contacts only a shallow trench isolation (STI) region and an upper surface of the wrap around contact directly contacts only an interlayer dielectric (ILD).

11. A semiconductor structure comprising:
a p-type epitaxial region and an n-type epitaxial region disposed over a substrate;
a dielectric pillar disposed between the p-type epitaxial region and the n-type epitaxial region; and
a respective wrap around contact on each of the p-type epitaxial region and the n-type epitaxial region, having a wrap around contact section adjacent the n-type epitaxial region with a different width than a wrap around contact section adjacent the p-type epitaxial region, such that a central via portion of each wrap around contact extends above a top surface of the dielectric pillar and onto the respective p-type epitaxial region and n-type epitaxial region, with a wrap around portion that is offset from the central via portion and that extends atop the top surface of the respective p-type epitaxial region and n-type epitaxial region, the central via portion having a greater thickness than a sidewall portion of the wrap around contact that is present on sidewalls of the respective p-type epitaxial region and n-type epitaxial region, and wherein a sidewall extension portion of each wrap around contact extends vertically above the sidewall portion of the wrap around contact in contact with the dielectric pillar.

12. The semiconductor structure of claim 11, wherein the wrap around contact is an irregular-shaped wrap around contact.

13. The semiconductor structure of claim 11, wherein vertical sidewalls of the wrap around contact are aligned with vertical sidewalls of the dielectric pillar.

14. The semiconductor structure of claim 11, wherein the dielectric pillar extends above topmost surfaces of the p-type epitaxial region and the n-type epitaxial region.

15. The semiconductor structure of claim 11, wherein the wrap around contact directly contacts sidewalls and topmost surfaces of the p-type epitaxial region and the n-type epitaxial region.

16. The semiconductor structure of claim 11, wherein an upper portion of the wrap around contact has a smaller critical dimensions (CD) than a lower portion of the wrap around contact.

17. The semiconductor structure of claim 16, wherein the lower portion of the wrap around contact is substantially uniform.

18. The semiconductor structure of claim 16, wherein a thickness of the lower portion of the wrap around contact is less than a thickness of the p-type epitaxial region and the n-type epitaxial region.

19. The semiconductor structure of claim 11, wherein a distance between a sidewall of the n-type epitaxial region and a sidewall of the dielectric pillar is at least 3 nm but less than 30 nm.

20. The semiconductor structure of claim 11, wherein a bottom surface of the wrap around contact directly contacts only a shallow trench isolation (STI) region and an upper surface of the wrap around contact directly contacts only an interlayer dielectric (ILD).

* * * * *